United States Patent [19]

Yagi

[11] Patent Number: 5,363,399
[45] Date of Patent: Nov. 8, 1994

[54] SEMICONDUCTOR DISTRIBUTED-FEEDBACK LASER DEVICE

[75] Inventor: Tetsuya Yagi, Itami, Japan

[73] Assignee: Mitsubishi Denki Kabushiki Kaisha, Tokyo, Japan

[21] Appl. No.: 978,476

[22] Filed: Nov. 18, 1992

[30] Foreign Application Priority Data

Nov. 21, 1991 [JP] Japan .................. 3-305875

[51] Int. Cl.⁵ .............................................. H01S 3/19
[52] U.S. Cl. ........................................ 372/96; 372/46
[58] Field of Search .............................. 372/43–50, 372/96

[56] References Cited

U.S. PATENT DOCUMENTS

| | | | |
|---|---|---|---|
| 4,622,673 | 11/1986 | Tsang | 372/45 |
| 4,716,570 | 12/1987 | Yoshida et al. | 372/45 |
| 4,722,092 | 1/1988 | Liau et al. | 372/96 |
| 4,796,274 | 1/1989 | Akiba et al. | 372/96 |
| 5,020,072 | 5/1991 | Abe et al. | 372/96 |
| 5,077,752 | 12/1991 | Tada et al. | 372/96 |
| 5,170,405 | 12/1992 | Connolly et al. | 372/48 |

FOREIGN PATENT DOCUMENTS

| | | |
|---|---|---|
| 1124279 | 5/1989 | European Pat. Off. . |
| 58-196088 | 11/1983 | Japan . |
| 60-25287 | 2/1985 | Japan . |
| 60-247986 | 12/1985 | Japan . |
| 62-2585 | 1/1987 | Japan . |
| 62-166582 | 7/1987 | Japan . |
| 63-241978 | 10/1988 | Japan . |
| 2-296386 | 12/1990 | Japan . |
| 2106706 | 4/1983 | United Kingdom . |

OTHER PUBLICATIONS

Luo et al., "Fabrication and Characteristics of a Gain-Coupled Distributed-Feedback Laser Diode"; Solid State Devices and Materials, Tokyo, 1988, pp. 327–330, Aug. 1988.
Itaya et al., "New 1.5 $\mu$m Wavelength GaInAsP/InP Distributed Feedback Laser", Electronics Letters, vol. 18, No. 23, Nov. 1982.
Luo et al., GaAlAs/GaAs Quantum Well Gain-Coupled Distributed Feedback Lasers, Extended Abstract of the International Conference on Solid State Devices and Materials, Yokohama, 1991 (Aug.), pp. 733–734.

Primary Examiner—John D. Lee
Attorney, Agent, or Firm—Leydig, Voit & Mayer

[57] ABSTRACT

A gain coupled distributed feedback semiconductor laser device includes regions with a predetermined period in an active layer or a cladding layer on the active layer in such a manner that a perturbation in the distribution of charge carriers injected into the active layer is produced which results in a perturbation in gain coefficient without increasing internal loss. The structure produces single-longitudinal-mode oscillation.

3 Claims, 6 Drawing Sheets

F I G. I  Prior Art

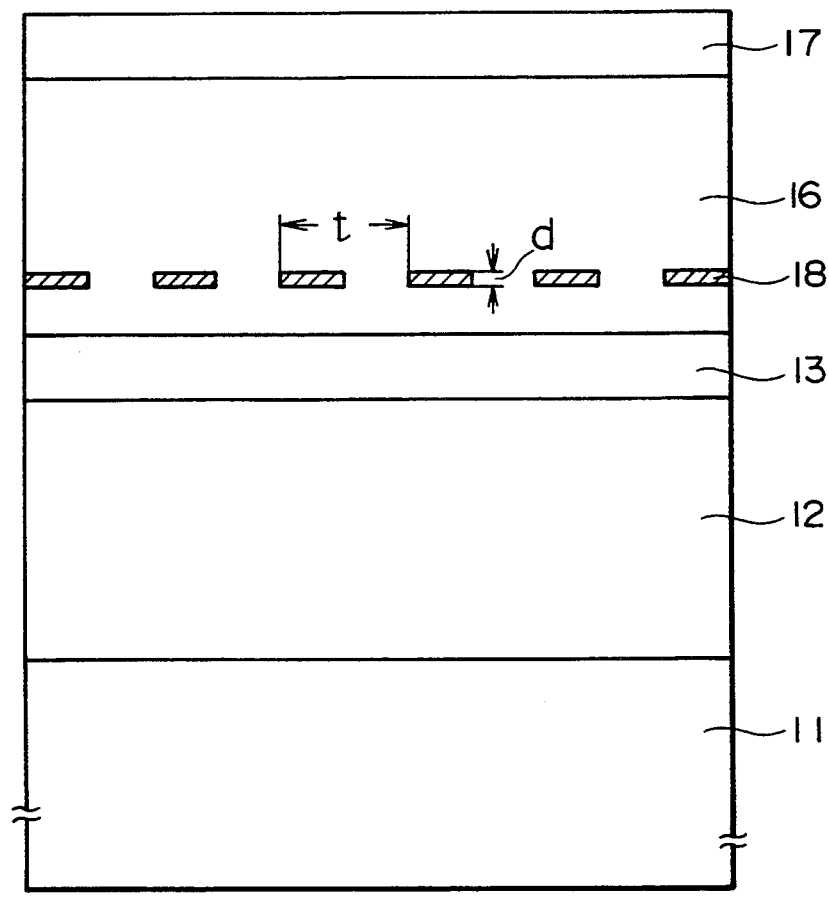
F I G. 2

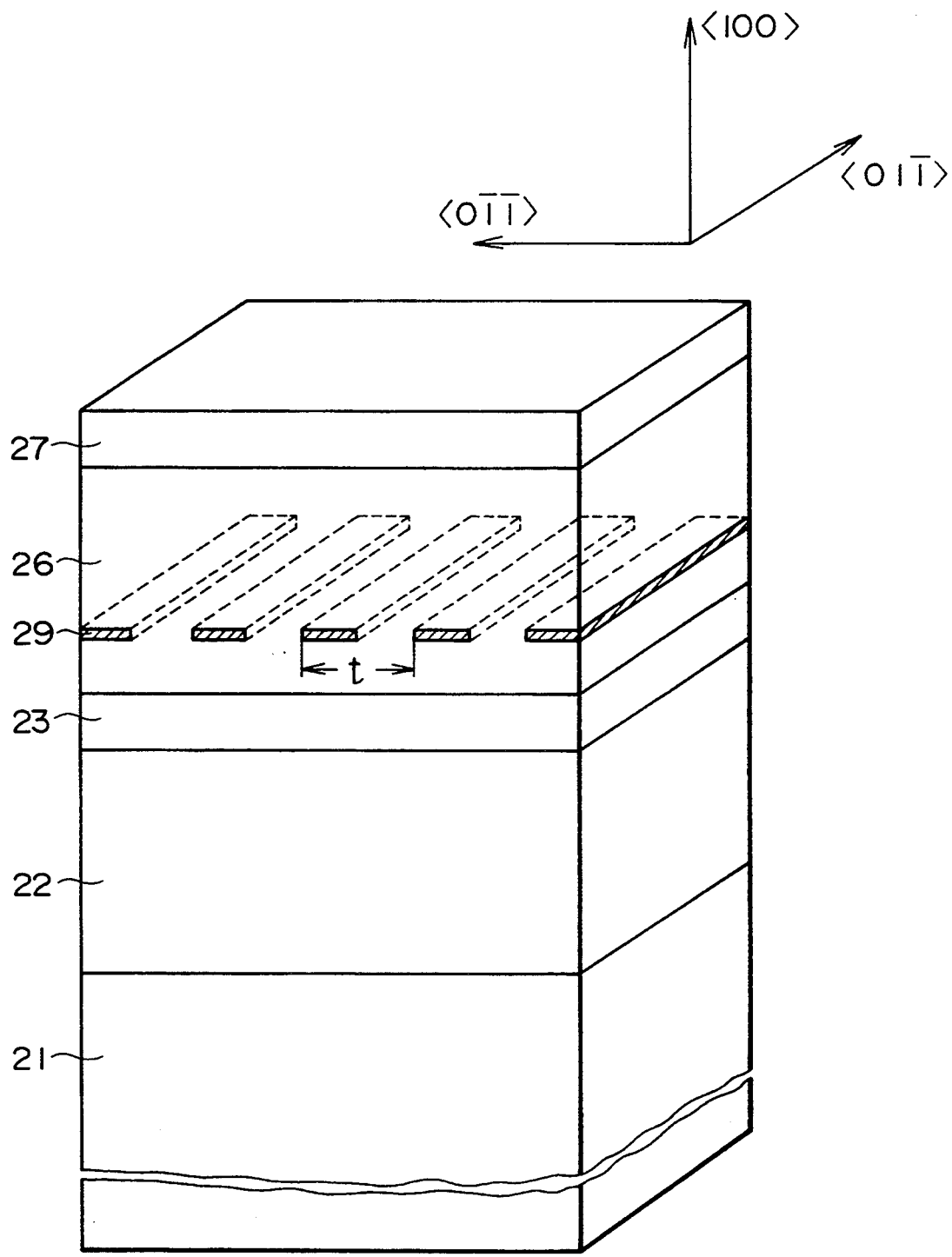
F I G. 3

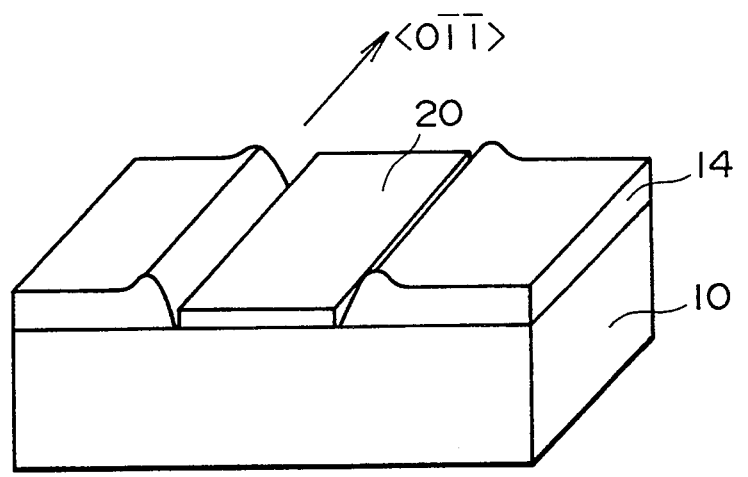
F I G. 4
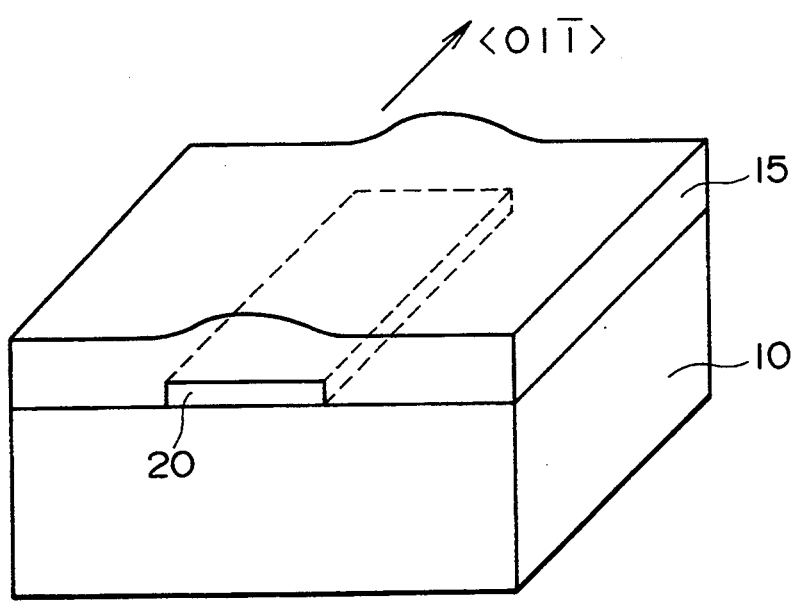
F I G. 5

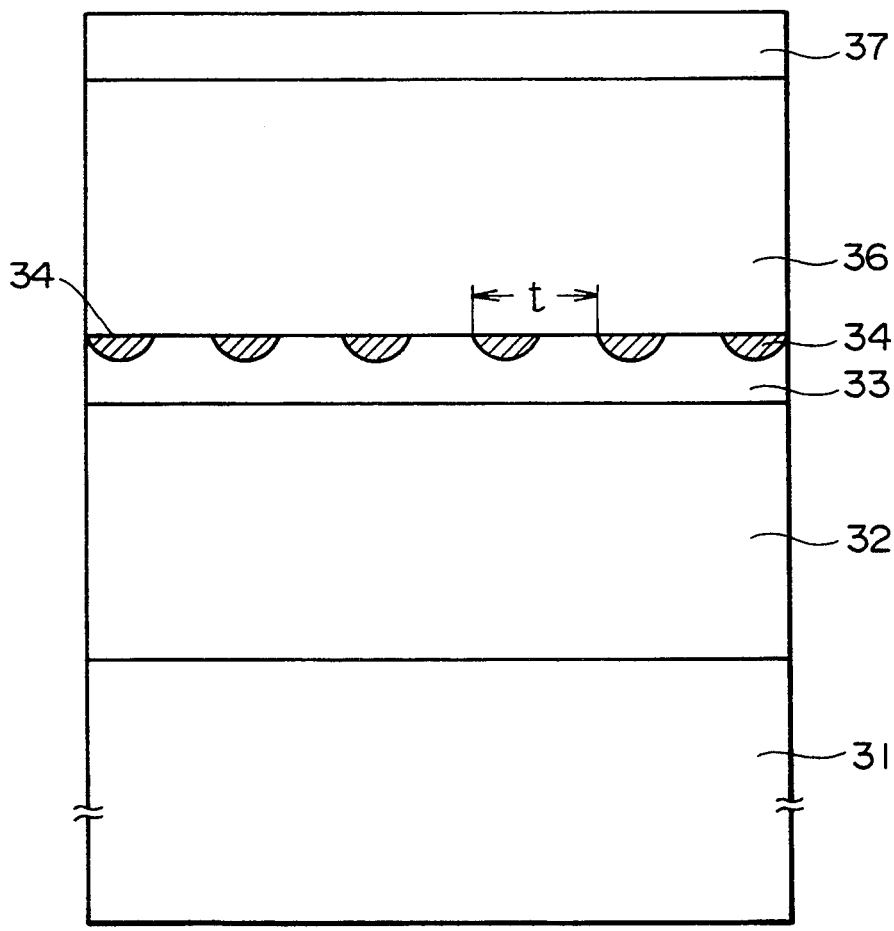
F I G. 6

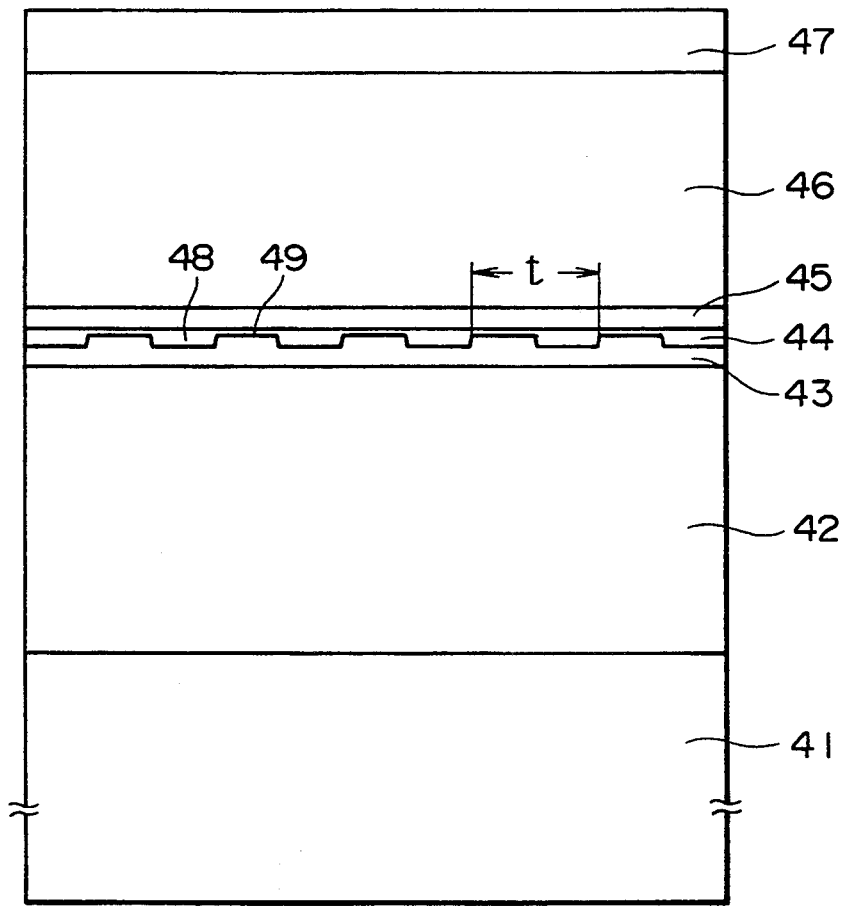
F I G. 7

SEMICONDUCTOR DISTRIBUTED-FEEDBACK LASER DEVICE

The present invention relates to a gain-coupled semiconductor distributed-feedback (DFB) laser device and, more particularly, to a gain-coupled semiconductor DFB laser device for single longitudinal-mode oscillation in which gain-coupling is available, by perturbation in gain coefficient without introducing internal loss.

BACKGROUND OF THE INVENTION

FIG. 1 is a cross-sectional view showing a schematic structure of a prior art gain-coupled semiconductor DFB laser device which is shown in an article "Fabrication and Characteristics of a Gain-Coupled Distributed-Feedback Laser Diode" by Yi Luo, Yoshiaki Nakano, and Kunio Tada, in *SSDM* (SOLID STATE DEVICES AND MATERIALS) Aug. 24–26, 1988, pages 327–330.

In FIG. 1, on an N+-type GaAs substrate 1, an $Al_{0.35}Ga_{0.65}As$ lower cladding layer 2, an undoped GaAs active layer 3, and a P-type $Al_{0.30}Ga_{0.70}As$ carrier confinement layer 4 are stacked in the named order. On the carrier confinement layer 4, a P-type GaAs waveguide layer 5 is disposed. The P-type GaAs waveguide layer 5 includes in its surface a second order diffraction grating corrugation 51 with a period t equal to, for example, 255 nm, formed by reactive ion etching (RIE). On the waveguide layer 5, a P-type $Al_{0.35}Ga_{0.65}As$ upper cladding layer 6 and a P+-type GaAs contact layer 7 are stacked in the named order.

When a bias voltage of suitable magnitude is applied between the P+-type GaAs contact layer 7 and the N+-type GaAs substrate 1, light is generated in the undoped GaAs active layer 3. This light is fed back by a perturbation in gain or loss coefficient due to the presence of the P-type GaAs waveguide layer 5 with the second-order diffraction grating corrugation 51 formed therein, and, therefore, only a single wavelength is selected and emitted.

As stated above, light generated in the undoped GaAs active layer 3 is fed back by a perturbation in gain or loss coefficient provided by the second-order diffraction grating corrugation 51. This is the reason a DFB laser device of this type is called gain-coupled DFB laser device.

In addition to the above-stated gain-coupled type device, DFB laser devices include a refractive-index-coupled DFB laser device like the one disclosed in Japanese Unexamined Patent Publication No. SHO 62-166582. In this refractive-index-coupled DFB laser device, light is fed back by a perturbation in the index of refraction which is provided by disposing, near an active layer, a corrugation formed by a material which is transparent to an oscillation wavelength.

The refractive-index-coupled DFB laser device has been long developed and has become practically usable. However, the refractive-index-coupled DFB laser device has a problem that it tends to produce a pair of longitudinal oscillation modes having the same threshold gain. Therefore, in order to obtain laser light of single longitudinal mode in the refractive-index-coupled DFB laser device, it is necessary to provide coatings that are extremely asymmetric in reflectivity with respect to each other, such as a front end coating having a reflectivity of 1% and a rear end coating having a reflectivity of 95%. Furthermore, even with such asymmetric coatings, the probability that the refractive-index-coupled DFB laser device will oscillate in a desired single longitudinal mode is about 50–70%.

In contrast, in general, gain-coupled DFB laser devices, including the one shown in FIG. 1, have the advantage that DFB laser devices oscillating in a single longitudinal mode can be fabricated with a good yield, because the gain-coupled DFB laser device has essentially only one longitudinal mode of oscillation having a minimum threshold gain.

As described above, however, in the conventional gain-coupled semiconductor DFB laser device shown in FIG. 1, because light is fed back by a perturbation in gain or loss coefficient provided by the P-type GaAs waveguide layer 5 with the second-order diffraction grating corrugation 51, and the corrugation 51 is continuous, the internal loss within the laser device is large, which results in an oscillation threshold current that is large and a light-emitting efficiency that is low.

Some prior art DFB laser devices with a single-longitudinal-mode oscillation achieved by feeding back light by a perturbation in loss coefficient, include a semi-insulating epitaxial layer as a current blocking layer. This laser device. however, has the disadvantage that its internal loss is large because of a number of deep energy levels present within a semi-insulating epitaxial layer.

SUMMARY OF THE INVENTION

An object of the present invention is to provide a semiconductor DFB laser device free of the above-stated disadvantages of conventional gain-coupled semiconductor DFB laser devices. The semiconductor DFB laser device of the present invention can provide gain coupling without increasing internal loss.

A gain-coupled semiconductor DFB laser device according to the present invention includes a plurality of current blocking layers formed in a cladding layer which, in turn, is disposed adjacent to an active layer. The current blocking layers have a conductivity type opposite to that of the cladding layer. The current blocking layers are disposed at a location close to the active layer within said cladding layer and are in the form of periodically arranged stripes of a fixed width spaced by a predetermined distance from each other. The current blocking layers have a thickness sufficiently larger than the diffusion length of minority carriers in the current blocking layers.

A gain-coupled semiconductor DFB laser device according to the present invention includes a substrate having a (100) plane, an active layer disposed on the substrate, and a cladding layer disposed adjacent to the active layer. In a portion of the cladding layer close to the active layer, there are disposed a plurality of amorphous insulating films in the form of periodic stripes having a fixed width which extend in the $<01\bar{1}>$ direction and are spaced by a predetermined distance from each other in the $<0\bar{1}1>$ direction. The thicknesses of the amorphous insulating films are large enough to prevent carriers from tunneling through the amorphous insulating films.

A gain-coupled DFB laser device according to the present invention includes an active layer in which a plurality of periodically arranged regions having a conductivity type opposite to that of the active layer and having a fixed width are disposed in the form of periodic stripes spaced by a predetermined distance from each other.

According to the present invention, a gain-coupled DFB laser device includes an active layer having a quantum well structure in which the well width is varied with a predetermined period.

According to the above-described invention, the periodic current blocking layers with a predetermined period disposed within the cladding layer adjacent to the active layer produce a periodic perturbation in gain coefficient in the active layer, which results in distributed feedback of light to provide desired single-longitudinal-mode oscillation.

In the semiconductor gain-coupled DFB laser device according to the present invention, the periodic amorphous insulating films, which extend in the $<01\bar{1}>$ direction and are spaced from each other with a predetermined period in the $<0\bar{1}1>$ direction, produce a periodic perturbation in gain coefficient in the active layer, which results in distributed feedback of light and, hence, desired single-longitudinal-mode oscillation.

According to the invention, the regions disposed with a predetermined period in the active layer and having a different conductivity type from the active layer produce a periodic perturbation in gain coefficient in the active layer, which results in distributed feedback of light, which, in turn, results in desired single-longitudinal-mode oscillation.

In a gain-coupled semiconductor DFB laser device according to the present invention, due to the provision of a quantum well structure having a well width varying periodically with a predetermined period, a periodic perturbation in gain coefficient in the active layer is produced, whereby distributed feedback of light is provided, which, in turn, produces single-longitudinal-mode oscillation.

BRIEF DESCRIPTION OF THE DRAWINGS

FIG. 2 is a cross-sectional view of a gain-coupled semiconductor DFB laser device according to a first embodiment of the present invention;

FIG. 3 is a cross-sectional view of a gain-coupled semiconductor DFB laser device according to a second embodiment of the present invention;

FIG. 4 is a perspective representation showing a crystallographic axis direction which is not suitable for forming amorphous insulating films for the gain-coupled DFB laser device of FIG. 3;

FIG. 5 is a perspective representation showing a crystallographic axis direction along which the amorphous films can be suitably aligned in the gain-coupled DFB laser device of FIG. 3;

FIG. 6 is a perspective view of a gain-coupled semiconductor DFB laser device according to a third embodiment of the present invention; and FIG. 7 is a perspective view of a gain-coupled semiconductor DFB laser device according to a fourth embodiment of the present invention.

DETAILED DESCRIPTION OF PREFERRED EMBODIMENTS

Figure 1:
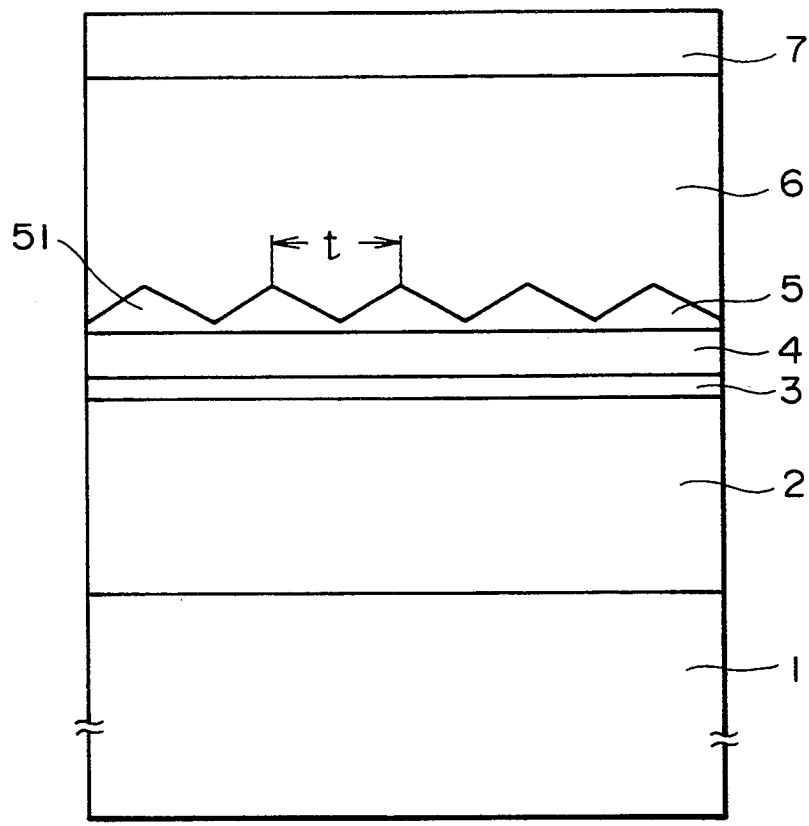
FIG. 1 shows an example of a conventional gain-coupled semiconductor DFB laser devices.

FIG. 2 is a cross-sectional view of a semiconductor gain-coupled DFB laser device according to a first embodiment of the present invention. On an N+-type GaAs substrate 11 having a thickness of, for example, 100 μm, an N-type $Al_{0.35}Ga_{0.65}As$ lower cladding layer 12 having a thickness of about 1 μm and an undoped GaAs active layer 13 having a thickness of about 0.1 μm are stacked in the named order.

A P-type $Al_{0.35}Ga_{0.65}As$ upper cladding layer 16 having a thickness of about 1 μm is disposed on the undoped GaAs active layer 13. N+-type $Al_{0.35}Ga_{0.65}As$ current blocking layers 18 are embedded, in the form of periodic stripes with a period t of, for example, 255 nm, in the P-type $Al_{0.35}Ga_{0.65}As$ upper cladding layer 16, at a distance of about 0.05 μm from the upper surface of the active layer 13. A P+-type GaAs contact layer 17 is disposed on the upper cladding layer 16.

The material of the N+-type $Al_{0.35}Ga_{0.65}As$ current blocking layers 18 has a larger band gap than the active layer 13, and the thickness d of the current blocking layers 18 is larger than the diffusion length of minority carriers therein. For example, if the carrier concentration of the current blocking layers 18 is on the order of $1 \times 10^{19} cm^{-3}$, the diffusion length of the minority carriers in the current blocking layers 18 is less than 10 nm, and, therefore, the thickness of the current blocking layers 18 should be larger than several tens of nanometers.

A bias of an appropriate magnitude is applied between the P+-type GaAs contact layer 17 and the N+-type GaAs substrate 11 with such a polarity that the contact layer is positive. Then, carriers are injected into the undoped GaAs active layer 13. However, since the N+-type $Al_{0.35}Ga_{0.65}As$ current blocking Layers 18 are located within the upper cladding layer 16 closer to the active layer 13, a spatial perturbation with a period determined by the period of the current blocking layers is produced in the distribution of carriers injected into the active layer 13, which, in turn, results in a perturbation in gain coefficient. This perturbation in gain coefficient provides distributed feedback of light so that desired single-longitudinal-mode oscillation is generated.

FIG. 3 is a perspective view of a semiconductor gain-coupled DFB laser device according to a second embodiment of the present invention. On a (100) plane surface of an N+-type GaAs substrate 21 having a thickness of, for example, 100 μm, an N-type $Al_{0.35}Ga_{0.65}As$ lower cladding layer 22 having a thickness of about 1 μm, and an undoped GaAs active layer 23 having a thickness of about 0.1 μm are stacked in the named order. A P-type $Al_{0.35}Ga_{0.65}As$ upper cladding layer 26 having a thickness of about 1 μm is disposed on the undoped GaAs active layer 23.

A plurality of amorphous insulating film layers 29 in the form of stripes are embedded in the P-type $Al_{0.35}Ga_{0.65}As$ upper cladding layer 26 at a distance of about 0.05 μm from the upper surface of the active layer 23. The stripes of the amorphous insulating film layers 29 extend in the $<01\bar{1}>$ direction and are disposed with a period t of 255 nm in the $<0\bar{1}1>$ direction. The material of the amorphous insulating film layers 29 is a material transparent to laser light, such as $SiO_2$ and SiN. A P+-type GaAs contact layer 27 is disposed on the upper cladding layer 26.

The thickness of the amorphous insulating film layers 29 is chosen so that carrier tunneling cannot occur. Specifically, the thickness of the layers 29 should be several tens of nanometers. The $SiO_2$ amorphous insulating film layers 29 are provided in the form of stripes which extend in the $<01\bar{1}>$ direction and are periodically disposed with a predetermined period in the $<0\bar{1}1>$ direction, for the following reason.

As shown in FIG. 4, if SiO$_2$ stripes 20 extending in the <01$\bar{1}$> direction are disposed on a (100) GaAs substrate 10 and a GaAs material is grown on the stripes 20 by MOCVD, epitaxial growth cannot take place on the SiO$_2$ stripes 20. That is, the SiO$_2$ stripes 20 cannot be embedded in an epitaxial layer 14.

As shown in FIG. 5, however, by disposing the SiO$_2$ stripes 20 to extend in the <0$\bar{1}$1> direction on the (100) GaAs substrate 10, a GaAs material deposited on the stripes 20 by MOCVD will grow laterally so that the SiO$_2$ stripes can be embedded in the epitaxially grown layer 15. This is the reason why the amorphous insulating film layers 29 extend in the <0$\bar{1}$1> direction and are periodically disposed with a predetermined period in the P-type Al$_{0.35}$Ga$_{0.65}$As upper cladding layer 26.

In the gain-coupled semiconductor DFB laser device shown in FIG. 3, when a bias of an appropriate magnitude is applied between the P+-type GaAs contact layer 27 and the N+-type GaAs substrate 21 with such a polarity that the contact layer 27 is positive, carriers are injected into the undoped GaAs active layer 23. However, since the amorphous insulating film layers 29 of, for example, SiO$_2$, are disposed with a period of 255 nm in the region of the upper cladding layer 26 close to the active layer 23, a spatial perturbation in distribution of carriers injected into the active layer 23 occurs, which results in a perturbation in gain coefficient. The gain coefficient perturbation provides distributed feedback of light, which, in turn, generates desired single-longitudinal-mode oscillation.

FIG. 6 is a cross-sectional view of a semiconductor gain-coupled DFB laser device according to a third embodiment of the present invention. In FIG. 6, on an N+-type GaAs substrate 31 having a thickness of, for example, 100 μm, an N-type Al$_{0.35}$Ga$_{0.65}$As lower cladding layer 32 having a thickness of about 1 μm and an N-type GaAs active layer 33 having a thickness of about 0.1 μm are stacked in the named order.

An acceptor, for example, is diffused into the upper region of the active layer 33 to form inverted-conductivity type regions 34 of P-type conductivity which is the conductivity type opposite to that of the N-type GaAs active layer 33. The inverted-conductivity type regions 34 are disposed with a period of t. A P-type Al$_{0.35}$Ga$_{0.65}$As upper cladding layer 36 is disposed on the active layer 33 with the inverted-conductivity type regions 34 formed therein. The thickness of the upper cladding layer 36 is about 1 μm. A P+-type GaAs contact layer 37 is disposed on the upper cladding layer 37.

It is so arranged that the forward voltage V$_F$ between the P-type, inverted-conductivity type regions 34 and the N-type GaAs active layer 33 is about 1.6 volts, and that the forward voltage V$_F$ between the upper cladding layer 36 and the active layer 33 is from about 1.7 volts to about 1.8 volts.

When a bias of a predetermined magnitude is applied between the P+-type GaAs contact layer 37 and the N+-type GaAs substrate 31 in such polarity that the contact layer 37 is positive, carriers are injected into the N-type GaAs active layer 33.

As stated above, since the forward voltage V$_F$ between the upper cladding layer 36 and the active layer 33 is about 1.7–1.8 volts, when the forward voltage V$_F$ between the inverted conductivity type regions 34 and the active layer 33 is about 1.6 volts, the carrier injection efficiency at locations where the P-type, inverted conductivity type regions 34 are not present is larger than the carrier injection efficiency at the locations where the regions 34 are present. This produces a spatial perturbation in the distribution of carriers injected into the active layer 33, which, in turn, causes a perturbation in gain coefficient. The perturbation in gain coefficient provides distributed feedback of light, which provides desired single-longitudinal-mode oscillation.

FIG. 7 is a cross-sectional view of a semiconductor gain-coupled DFB laser device according to a fourth embodiment of the present invention. On an N+-type GaAs substrate 41 having a thickness of, for example, 100 μm, an N-type Al$_{0.35}$Ga$_{0.65}$As lower cladding layer 42 having a thickness of about 1 μm is disposed. On this N-type Al$_{0.35}$Ga$_{0.65}$As lower cladding layer 42, an N-type Al$_{0.20}$Ga$_{0.80}$As first barrier layer 43 having a thickness of several hundreds of angstroms (Å) is disposed.

An undoped GaAs active layer 44 having a quantum well structure is disposed on the first barrier layer 43. The quantum well structure includes regions 48 having a well width of 100 Å, i.e., layer thickness, disposed with a period t of 245 nm, and regions 49 having a well width of 50 Å which alternate with, i.e., layer thickness, the regions 48. A P-type Al$_{0.20}$Ga$_{0.80}$As second barrier layer 45 having a thickness of several hundreds of angstroms (Å), a P-type Al$_{0.35}$Ga$_{0.65}$As upper cladding layer 46 having a thickness of about 1 μm, and a P+-type GaAs contact layer 47 are stacked in the named order on the active layer 44. The period t with which the well width alternates is determined in accordance with the wavelength λ of laser light to be emitted.

In the semiconductor gain-coupled DFB laser device shown in FIG. 7, when a bias of a given magnitude is applied between the P+-type GaAs contact layer 47 and the N+-type GaAs substrate 41 with polarity such that the contact layer 47 is positive, carriers are injected into the undoped GaAs active layer 44 of quantum well structure.

As described above, since the active layer 44 includes the regions 48 having a well width of 100 Å arranged with a period of 245 nm, and the regions 49 having a well width of 50 Å alternating with the regions 48, the gain for, for example, light at 840 nm, at the regions having a well width of 100 Å is large, while the gain at the regions having a well width of 50 Å is small. This causes a spatial perturbation in the distribution of carriers injected into the active layer 44. Thus, a perturbation in gain coefficient is provided, which provides distributed feedback of light, and, hence, desired single-longitudinal-mode oscillation occurs.

One prior art semiconductor laser device has a structure in which a multi-quantum well is formed in an active layer, the well layer density is changed periodically along the light propagating direction by periodically changing the thickness of the barrier layer of the multi-quantum well so that the gain in the active layer has a periodicity along the light propagating direction to produce a gain-coupled state, and oscillations at a single wavelength corresponding to the period of the gain occur. Such a laser device is shown in Japanese Unexamined Patent Publication No. HEI 2-296386. In this laser device, the gain at a particular length is made to periodically change from location to location by changing the well layer density.

In contrast, in the semiconductor DFB laser device of the present invention shown in FIG. 7, the well width in the quantum well structure active layer 44 is changed periodically along the light propagating direction to thereby periodically change the gain at a particular wavelength, which produces a perturbation for feeding back light. Thus, the concept of the present invention is quite different from the concept of the invention disclosed in the above-cited Japanese Unexamined Patent Publication No. HEI 2-296386.

As described above, according to the present invention, a spatial perturbation in the distribution of carriers injected into an active layer is produced, which, in turn, produces a perturbation in gain coefficient. Thus, the present invention can provide a semiconductor DFB laser device which achieves gain coupling without increasing internal loss.

The individual embodiments are briefly summarized. According to the first embodiment shown in FIG. 2, a plurality of current blocking layers 18 having a thickness larger than the diffusion length of minority carriers in the current blocking layers 18 are disposed with a predetermined period in the upper cladding layer 16 in a region close to the active layer 13, which makes it possible to produce desired single-longitudinal-mode oscillation without increasing internal loss.

According to the second embodiment shown in FIG. 3, a plurality of amorphous insulating films 29 having a fixed width and a thickness sufficiently large to prevent carriers from tunneling therethrough, and extending in the $<01\bar{1}>$ direction are arranged in the $<0\bar{1}1>$ direction with a predetermined period in the upper cladding layer 26 at a location close to the active layer 23, which enables desired single-longitudinal-mode oscillation without increasing internal loss. In addition, this structure has an advantage that the laser device is easily fabricated by epitaxial growth using MOCVD.

According to the third embodiment shown in FIG. 6, the active layer 33 contains regions 34 having a different conductivity type from that of the active layer 33, which are disposed with a predetermined period, which also enables desired single-longitudinal-mode oscillation without resulting increase in internal loss.

According to the fourth embodiment shown in FIG. 7, the active layer 44 itself is configured as a quantum well structure with a well width changing periodically, which results in desired single-longitudinal-mode oscillation without increase in internal loss.

What is claimed is:

1. A semiconductor distributed feedback laser device comprising:

an active layer disposed on a substrate having a (100) surface;

a cladding layer grown on the (100) surface of said active layer by metal organic chemical vapor deposition; and a plurality of amorphous insulating layers embedded within said cladding layer spaced from and close to said active layer, said amorphous insulating layers being stripes having a constant width and a thickness large enough to prevent carriers from tunneling therethrough, extending in the $<01\bar{1}>$ direction, being spaced from each other in the $<0\bar{1}1>$ direction, and arranged with a predetermined period.

2. The semiconductor distributed feedback laser device according to claim 1 wherein said active layer is undoped GaAs layer having a thickness of about 0.1 $\mu$m, said cladding layer is a P-type $Al_{0.35}Ga_{0.65}As$ layer having a thickness of about 1 $\mu$m, and said amorphous insulating layers are transparent to laser light and are located within said cladding layer at a distance of about 0.05 $\mu$m from said active layer.

3. A semiconductor distributed feedback laser device comprising:

a first conductivity type GaAs substrate having a (100) surface and having a predetermined thickness;

a first conductivity type $Al_{0.35}Ga_{0.65}As$ lower cladding layer having a thickness of about 1 $\mu$m disposed on said surface;

an undoped GaAs active layer having a thickness of about 0.1 $\mu$m disposed on said lower cladding layer;

a second conductivity type, opposite the first conductivity type, $Al_{0.35}Ga_{0.65}As$ upper cladding layer having a thickness of about 1 $\mu$m disposed on said active layer;

a plurality of amorphous insulating layers embedded in said upper cladding layer at a distance of about 0.05 $\mu$m from said active layer, said amorphous insulating layers extending in the $<01\bar{1}>$ direction and being spaced from each other with a predetermined period in the $<0\bar{1}1>$ direction; and a contact layer of the second conductivity type disposed on said upper cladding layer, said amorphous insulating layers being transparent to laser light and having a thickness that charge carriers cannot tunnel through.

* * * * *